United States Patent
Senoue et al.

(10) Patent No.: US 8,223,902 B2
(45) Date of Patent: Jul. 17, 2012

(54) COMPLEX SIGNAL PROCESSING CIRCUIT, RECEIVER CIRCUIT, AND SIGNAL REPRODUCTION DEVICE

(75) Inventors: Fumiaki Senoue, Osaka (JP); Kouichi Nagano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/206,226

(22) Filed: Aug. 9, 2011

(65) Prior Publication Data
US 2011/0293046 A1    Dec. 1, 2011

Related U.S. Application Data

(63) Continuation of application No. PCT/JP2010/004525, filed on Jul. 13, 2010.

(30) Foreign Application Priority Data

Mar. 19, 2010    (JP) .................................. 2010-063609

(51) Int. Cl.
H03D 1/04    (2006.01)
H04B 1/10    (2006.01)
(52) U.S. Cl. ................. 375/346; 375/324; 375/340
(58) Field of Classification Search ............ 375/324, 375/340, 346–350
See application file for complete search history.

(56) References Cited

U.S. PATENT DOCUMENTS
6,249,179 B1    6/2001    Maalej et al.
7,218,685 B2    5/2007    Ide et al.
2003/0072393 A1*    4/2003    Gu ................................ 375/322
2005/0147184 A1    7/2005    Matsuno
2006/0067435 A1    3/2006    Ogawa et al.
2007/0080835 A1*    4/2007    Maeda et al. ................. 341/120

FOREIGN PATENT DOCUMENTS

| | | |
|---|---|---|
| JP | 10-056484 | 2/1998 |
| JP | 2003-283255 | 10/2003 |
| JP | 2003-283354 | 10/2003 |
| JP | 2003-309612 | 10/2003 |
| JP | 2004-522363 | 7/2004 |
| JP | 2006-094245 | 4/2006 |
| JP | 2006-094252 | 4/2006 |
| JP | 2007-104522 | 4/2007 |
| WO | WO 2010/035359 A1 | 4/2010 |

* cited by examiner

Primary Examiner — Curtis Odom
(74) Attorney, Agent, or Firm — McDermott Will & Emery LLP

(57) ABSTRACT

An analog complex filter combines an in-phase signal and a quadrature signal to output first and second analog signals. An analog-to-digital converter converts the first and second analog signals into first and second digital signals. A digital complex filter attenuates components corresponding to the quadrature signal and the in-phase signal of the first and second digital signals, respectively. A digital bandwidth limited filter allows a target component and an image component contained in the digital complex signal composed of the first and second digital signals from the digital complex filter to pass therethrough, and attenuates an adjacent interference component. An IQ imbalance correction circuit corrects a quadrature error and an amplitude error between the first and second digital signals from the digital band-pass filter.

7 Claims, 9 Drawing Sheets

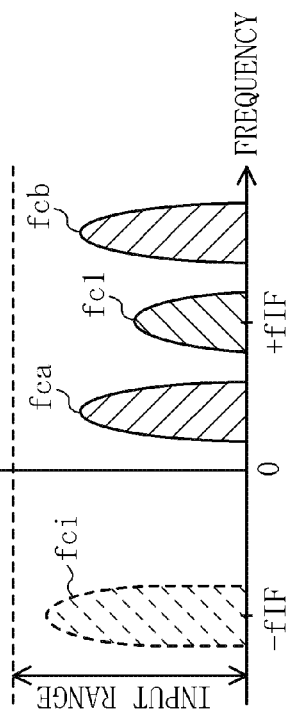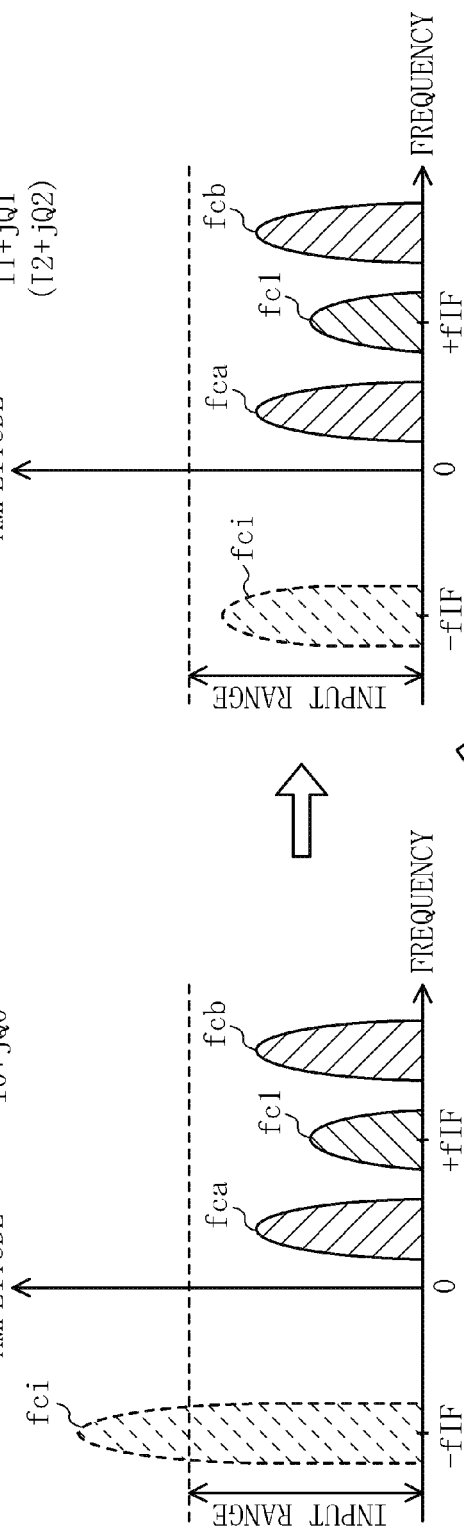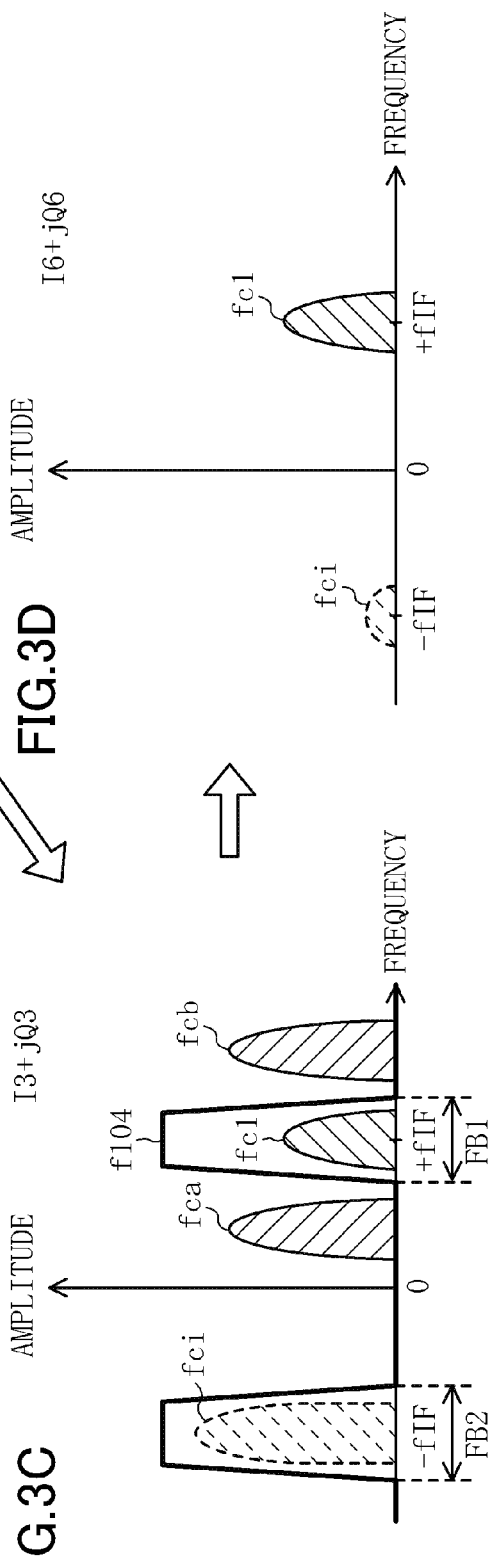
FIG.3A  FIG.3B  FIG.3C  FIG.3D

COMPLEX SIGNAL PROCESSING CIRCUIT, RECEIVER CIRCUIT, AND SIGNAL REPRODUCTION DEVICE

CROSS-REFERENCE TO RELATED APPLICATION

This is a continuation of PCT International Application PCT/JP2010/004525 filed on Jul. 13, 2010, which claims priority to Japanese Patent Application No. 2010-063609 filed on Mar. 19, 2010. The disclosures of these applications including the specifications, the drawings, and the claims are hereby incorporated by reference in their entirety.

BACKGROUND

The technology disclosed herein refers to complex signal processing circuits which process a complex signal including an in-phase signal and a quadrature signal, and more particularly, to techniques of improving the accuracy of correction of a quadrature error and an amplitude error between an in-phase signal and a quadrature signal in complex signal processing circuits including an analog complex filter.

Conventionally, in the field of wireless communication, there is a technique called low-IF reception in which a radio frequency signal (RF signal) is downconverted into an intermediate frequency signal (IF signal) having a frequency in the vicinity of a baseband. In the low-IF reception, the IF signal has the reduced frequency and therefore the number of parts can be reduced, whereby the integration density of a receiver system can be increased, compared to a standard superheterodyne technique.

FIG. 8 shows a configuration of a conventional low-IF receiver circuit. A quadrature detector 93 multiplies a radio frequency signal RF which has been passed through a low-noise amplifier (LNA) 91 by a local signal LOi output from a local oscillator (LO) 92 to output an in-phase signal I90, and multiplies the radio frequency signal RF by a local signal LOq to output a quadrature signal Q90. Thus, the radio frequency signal RF is converted into an intermediate frequency signal (an analog complex signal (I90+jQ90) including the in-phase signal I90 and the quadrature signal Q90). Note that "j" is the imaginary unit. Note that, in the description that follows, a complex signal including an in-phase signal Ix and a quadrature signal Qx is represented as (Ix+jQx).

The radio frequency signal RF may contain an image component. The frequency of the image component and the frequency of a target component are located on the frequency axis at positions symmetrical with respect to the frequency of the local signal LOi. Therefore, the image component and the target component are mixed together due to frequency conversion performed by the quadrature detector 93, so that the image component can no longer be separated from the target component. Therefore, the image component needs to have been sufficiently attenuated in the analog complex signal (I90+jQ90). Such a technique of rejecting the image component is described in Japanese Patent Publication No. 2003-283354, etc.

Analog-to-digital converters (ADCs) 94$i$ and 94$q$ each convert the in-phase signal I90 and the quadrature signal Q90 into digital signals, i.e., an in-phase signal I92 and a quadrature signal Q92, respectively. An IQ imbalance correction circuit (IQ) 95 corrects a quadrature error and an amplitude error (IQ imbalance) between the in-phase signal I92 and the quadrature signal Q92, and outputs the results as an in-phase signal I93 and a quadrature signal Q93. A digital complex filter (DCF) 96 applies a complex operation to the in-phase signal I93 and the quadrature signal Q93 output from the IQ imbalance correction circuit 95 in order to reject the image component of the digital complex signal (I93+jQ93), and outputs the results as an in-phase signal I94 and a quadrature signal Q94, respectively. A digital signal processing circuit (DSP) 97 demodulates data based on the output of the digital complex filter 96.

By thus correcting the IQ imbalance using the IQ imbalance correction circuit 95, the image rejection ratio of the digital complex filter 96 can be improved. Such an IQ imbalance correction technique is described in Japanese Patent Publication Nos. H10-56484 and 2003-309612, etc.

When, however, an image rejection ratio desired for the analog complex signal (I90+jQ90) (i.e., the difference in image component signal level between the analog complex signal (I90+jQ90) and the digital complex signal (I94+jQ94)) is larger than the input range (i.e., the difference between the maximum input level and the noise level) of the analog-to-digital converters 94$i$ and 94$q$, the analog-to-digital converters 94$i$ and 94$q$ cannot accurately convert the analog complex signal (I90+jQ90).

As shown in FIG. 9, therefore, an analog complex filter 90 for attenuating the image component of the analog complex signal (I90+jQ90) is provided at a stage preceding the analog-to-digital converters 94$i$ and 94$q$. The analog complex filter 90 combines the in-phase signal I90 and the quadrature signal Q90 to output an in-phase signal I91 and a quadrature signal Q91.

SUMMARY

In the conventional receiver circuit of FIG. 9, however, the in-phase signal I91 and the quadrature signal Q91 output from the analog complex filter 90 each contain an unnecessary component. Specifically, the analog complex signal (I91+jQ91) is defined as $$(I91 + jQ91) = (I90 + jQ90) \times (H91(s) + jH92(s))$$
$$= (H91(s)I90 - H92(s)Q90) +$$
$$j(H92(s)I90 + H91(s)Q90)$$

where $(H91(s) + jH92(s))$ is the transfer function of the analog complex filter 90.

Thus, the in-phase signal I91 and the quadrature signal Q91 are $I91 = H91(s)I90 - H92(s)Q90$ $Q91 = H92(s)I90 + H91(s)Q90.$ Thus, the in-phase signal I91 contains an in-phase component (a component corresponding to the in-phase signal I90) and, in addition, a quadrature component (a component corresponding to the quadrature signal Q90). Similarly, the quadrature signal Q91 contains a quadrature component, and in addition, an in-phase component. Therefore, the IQ imbalance correction circuit 95 cannot accurately correct the quadrature error and the amplitude error (IQ imbalance) between the in-phase signal I92 and the quadrature signal Q92. Moreover, when the radio frequency signal RF contains not only the target component (signal component corresponding to frequency to be received) but also adjacent interference components (signal components adjacent to the target component on the frequency axis), the adjacent interference components leak into a target frequency band corresponding to the target component during the processing in the IQ imbalance correction circuit 95, so that the quality of the target component may degrade. For this reason, the IQ imbalance cannot be accurately corrected. Because the IQ imbalance cannot be accurately corrected, it is difficult to improve the image rejection ratio of the digital complex filter 96.

The present disclosure describes implementations of a technique of improving the accuracy of correction of the IQ imbalance in a complex signal processing circuit including an analog complex filter.

An example complex signal processing circuit for processing an analog complex signal including an in-phase signal and a quadrature signal, includes an analog complex filter configured to combine the in-phase signal with the quadrature signal and output the resultant signal as a first analog signal, and combine the quadrature signal with the in-phase signal and output the resultant signal as a second analog signal, to attenuate an image component contained in the analog complex signal; an analog-to-digital converter configured to convert the first and second analog signals into first and second digital signals, respectively; a first digital complex filter configured to apply a complex operation to the first and second digital signals to attenuate a component corresponding to the quadrature signal of the first digital signal and output the resultant signal as a third digital signal, and attenuate a component corresponding to the in-phase signal of the second digital signal and output the resultant signal as a fourth digital signal; a digital bandwidth limited filter configured to apply a complex operation to the third and fourth digital signals to allow a target component and an image component of a digital complex signal including the third and fourth digital signals to pass therethrough, and attenuate an adjacent interference component adjacent to the target component on a frequency axis, and output the resultant signals as fifth and sixth digital signals; and an IQ imbalance correction circuit configured to correct a quadrature error and an amplitude error between the fifth and sixth digital signals.

In the complex signal processing circuit, the first digital complex filter can attenuate an unnecessary component in each of the first and second digital signals, whereby the IQ imbalance correction circuit can accurately correct a quadrature error and an amplitude error (IQ imbalance) between the fifth digital signal and the sixth digital signal. Moreover, attenuating the adjacent interference component by the digital bandwidth limited filter can reduce a degradation in quality of the target component caused by the leakage of the adjacent interference component, so that the accuracy of correction of the IQ imbalance can further be improved.

Note that the digital bandwidth limited filter may include a band-pass filter having a passband including a frequency band corresponding to the target component and a frequency band corresponding to the image component, or may include a band-elimination filter having a stop band including a frequency band corresponding to the adjacent interference component adjacent to the target component.

The complex signal processing circuit may further include a second digital complex filter configured to reject an image component contained in a digital complex signal including the fifth and sixth digital signals corrected by the IQ imbalance correction circuit.

In the complex signal processing circuit, the IQ imbalance between the fifth and sixth digital signals can be accurately corrected, whereby the image rejection ratio of the second digital complex filter can be improved.

The complex signal processing circuit may further include a control circuit configured to cause the digital bandwidth limited filter to be inactive when the difference in adjacent interference component signal level between the digital complex signal including the third and fourth digital signals and the digital complex signal including the fifth and sixth digital signals is smaller than a predetermined value.

The complex signal processing circuit can reduce the unnecessary power consumption of the digital bandwidth limited filter, and in addition, can prevent noise occurring due to unnecessary operation of the digital bandwidth limited filter.

BRIEF DESCRIPTION OF THE DRAWINGS

FIGS. 3A-3D are diagrams for describing operation of a complex signal processing circuit shown in FIG. 1.

DETAILED DESCRIPTION

Figure 1:
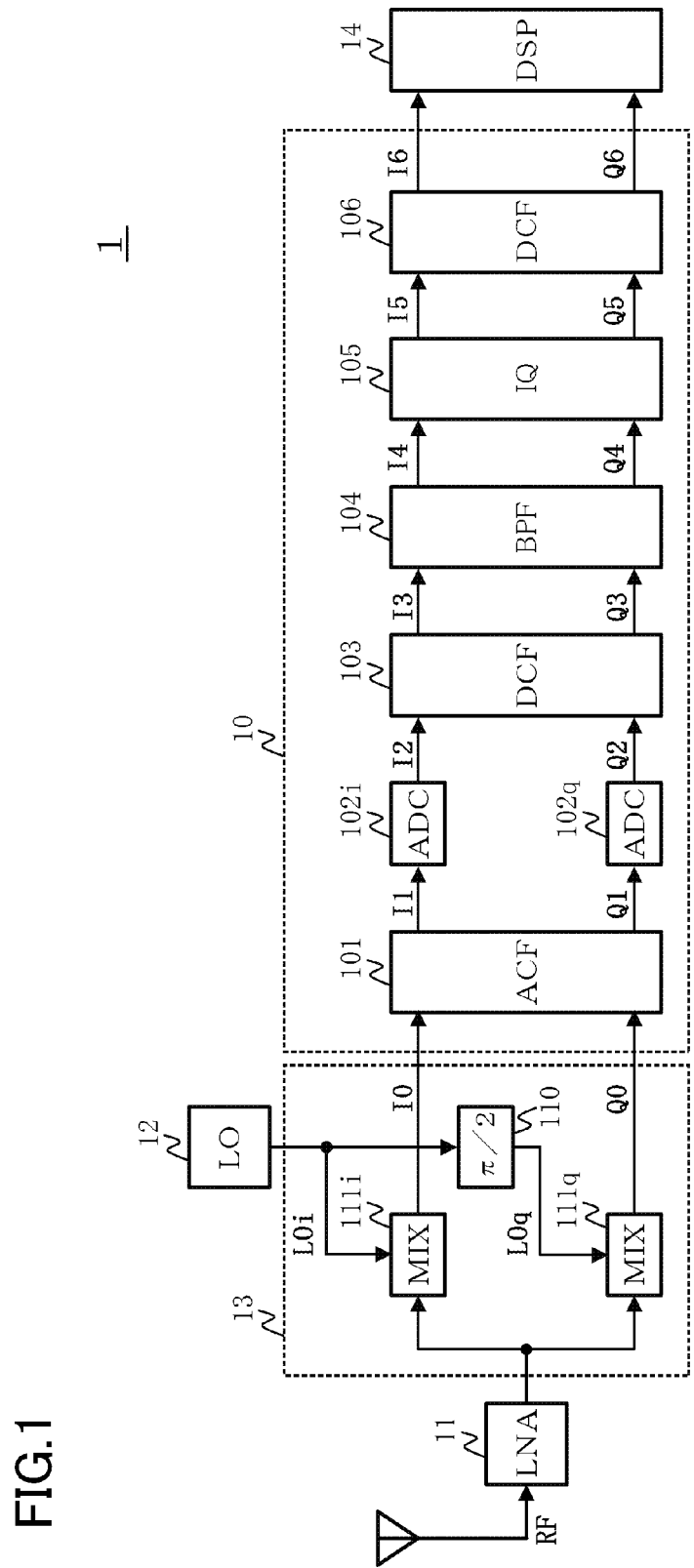
FIG. 1 is a diagram showing an example configuration of a receiver circuit according to a first embodiment.

Embodiments of the present disclosure will be described in detail hereinafter with reference to the accompanying drawings. In the drawings, similar reference characters refer to the same or similar elements, and the explanation thereof will be omitted.

(First Embodiment)

FIG. 1 shows an example configuration of a receiver circuit according to a first embodiment. The receiver circuit 1 demodulates data (e.g., video data, audio data, etc.) from a radio frequency signal RF. Examples of the receiver circuit 1 include a radio tuner, a digital television tuner, etc. The receiver circuit 1 includes a low-noise amplifier (LNA) 11, a local oscillator (LO) 12, a quadrature detector 13, a complex signal processing circuit 10, and a digital signal processing circuit (DSP) 14. Note that, here, it is assumed that the receiver circuit 1 is a low-IF receiver.

The low-noise amplifier 11 amplifies a radio frequency signal RF received by an antenna. The local oscillator 12 outputs a local signal LOi. The frequency of the local signal LOi is lower than that of the radio frequency signal RF. The quadrature detector 13 multiplies the radio frequency signal RF amplified by the low-noise amplifier 11 by the local signal LOi to output an in-phase signal I0, and multiplies the radio frequency signal RF by a local signal LOq (a signal which is out of phase with the local signal LOi by $\pi/2$) to output a quadrature signal Q0. For example, the quadrature detector 13 includes a phase shifter 110 which delays the local signal LOi by ($\pi/2$) to output the result as the local signal LOq, a mixer (MIX) 111$i$ which multiplies the radio frequency signal RF by the local signal LOi, and a mixer 111$q$ which multiplies the radio frequency signal RF by the local signal LOq. Thus, the radio frequency signal RF is converted into an intermediate frequency signal (an analog complex signal (I0+jQ0) including the in-phase signal I0 and the quadrature signal Q0).

The complex signal processing circuit 10 processes the analog complex signal (I0+jQ0) output from the quadrature detector 13 to output a digital complex signal (I6+jQ6). The digital signal processing circuit 14 demodulates data based on the digital complex signal (I6+jQ6) output from the complex signal processing circuit 10.

[Complex Signal Processing Circuit]

The complex signal processing circuit 10 includes an analog complex filter (ACF) 101, analog-to-digital converters (ADCs) 102i and 102q, a digital complex filter (DCF) 103, a band-pass filter (BPF) 104, an IQ imbalance correction circuit (IQ) 105, and a digital complex filter 106.

Figure 2:
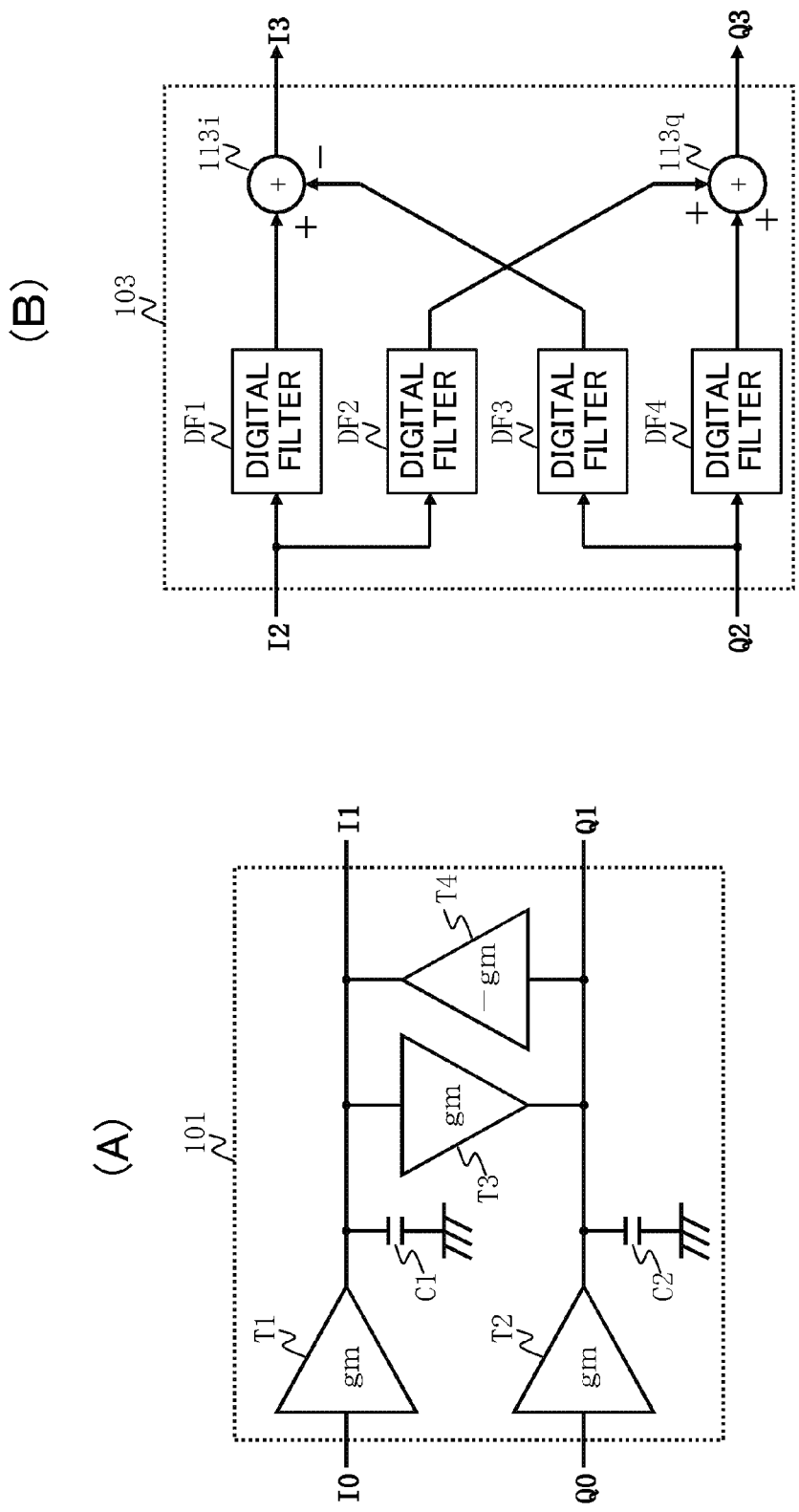
FIG. 2A is a diagram showing an example internal configuration of an analog complex filter shown in FIG. 1.
FIG. 2B is a diagram showing an example internal configuration of a digital complex filter shown in FIG. 1.

In order to attenuate the image component of the analog complex signal (I0+jQ0), the analog complex filter 101 combines the in-phase signal I0 with the quadrature signal Q0 and outputs the result as an in-phase signal I1, and combines the quadrature signal Q0 with the in-phase signal I0 and outputs the result as a quadrature signal Q1. For example, as shown in FIG. 2A, the analog complex filter 101 includes transconductance amplifiers T1, T2, and T3 having a positive transconductance, a transconductance amplifier T4 having a negative transconductance, and capacitors C1 and C2.

The analog-to-digital converter 102i converts the in-phase signal I1 into a digital signal (in-phase signal I2). The analog-to-digital converter 102q converts the quadrature signal Q1 into a digital signal (quadrature signal Q2).

The digital complex filter 103 applies a complex operation to the in-phase signal I2 and the quadrature signal Q2, and outputs the results of the operation as an in-phase signal I3 and a quadrature signal Q3. For example, as shown in FIG. 2B, the digital complex filter 103 includes digital filters DF1, DF2, DF3, and DF4 including an IIR filter, an FIR filter, etc., and adders 113i and 113q.

The band-pass filter 104 (digital bandwidth limited filter) applies a complex operation to the in-phase signal I3 and the quadrature signal Q3 to allow a target component and an image component contained in the digital complex signal (I3+jQ3) to pass therethrough and to attenuate adjacent interference components contained in the digital complex signal (I3+jQ3), and outputs the results of the operation as an in-phase signal I4 and a quadrature signal Q4. Note that the target component is a signal component to be processed (to be received), the image component is a signal component located on a frequency axis at a position symmetrical to the target component with respect to the frequency of the local signal LOi, and the adjacent interference components are signal components adjacent to the target component on the frequency axis. Here, the band-pass filter 104 has such a filter characteristic that a passband includes a target frequency band corresponding to the target component contained in the digital complex signal (I3+jQ3) and an image frequency band corresponding to the image component contained in the digital complex signal (I3+jQ3), and a stop band includes other frequency bands.

The IQ imbalance correction circuit 105 corrects a quadrature error and an amplitude error (IQ imbalance) between the in-phase signal I4 and the quadrature signal Q4, and outputs the corrected in-phase signal I4 and quadrature signal Q4 as an in-phase signal I5 and a quadrature signal Q5.

In order to reject the image component of the digital complex signal (I5+jQ5), the digital complex filter 106 applies a complex operation to the in-phase signal I5 and the quadrature signal Q5, and outputs the results of the operation as an in-phase signal I6 and a quadrature signal Q6.

[Operation]

Next, operation of the complex signal processing circuit 10 of FIG. 1 will be described with reference to FIGS. 3A-3D.

Initially, the quadrature detector 13 converts the radio frequency signal RF into the analog complex signal (I0+jQ0). As shown in FIG. 3A, the analog complex signal (I0+jQ0) contains a target component fc1 corresponding to a target frequency (+fIF) and an image component fci corresponding to an image frequency (−fIF). Here, the analog complex signal (I0+jQ0) further contains adjacent interference components fca and fcb.

Next, the analog complex filter 101 attenuates the image component fci contained in the analog complex signal (I0+jQ0) and outputs the result as an analog complex signal (I1+jQ1). As shown in FIG. 3B, the signal level of the image component fci contained in the analog complex signal (I1+jQ1) falls within the input range of the analog-to-digital converters 102i and 102q.

Next, the analog complex signal (I1+jQ1) is processed and converted into the digital complex signal (I3+jQ3) by the analog-to-digital converters 102i and 102q, and the digital complex filter 103. Next, the digital complex signal (I3+jQ3) is processed and converted into the digital complex signal (I4+jQ4) by the band-pass filter 104. As illustrated in FIG. 3C, the band-pass filter 104 has such a filter characteristic f104 that a passband includes a target frequency band FB1 and an image frequency band FB2 corresponding to the target component fc1 and the image component fci, respectively. Thus, the adjacent interference components fca and fcb are removed from the digital complex signal (I3+jQ3), and the target component fc1 and the image component fci contained in the digital complex signal (I3+jQ3) are output as the digital complex signal (I4+jQ4).

Next, the digital complex signal (I4+jQ4) is processed and converted into the digital complex signal (I6+jQ6) by the IQ imbalance correction circuit 105 and the digital complex filter 106. As shown in FIG. 3D, an image component contained in the digital complex signal (I6+jQ6) is rejected by the complex operation of the digital complex filter 106.

[Process By Digital Complex Filter]

Next, a process performed by the digital complex filter 103 will be described. Note that the transfer functions of the analog complex filter 101 and the digital complex filter 103 are represented by the analog transfer function of the analog complex filter 101: $H1(s)+jH2(s)$ a transfer function obtained by applying the bilinear transform to the analog transfer function: $H1(z)+jH2(z)$ the digital transfer function of the digital complex filter 103: $H3(z)+jH4(z)$.

Here, it is assumed that the real part $H3(z)$ of the digital transfer function corresponds to the real part $H1(z)$ of the transfer function $(H1(z)+jH2(z))$, and the imaginary part $H4(z)$ of the digital transfer function corresponds to the sign-reversed version $(-H2(z))$ of the imaginary part $H2(z)$ of the transfer function $(H1(z)+jH2(z))$.

The analog complex filter 101 applies the following complex operation to the analog complex signal (I0+jQ0) to output the analog complex signal (I1+jQ1):

$$(I1 + jQ1) = (H1(s) + jH2(s)) \times (I0 + jQ0)$$
$$= (H1(s)I0 - H2(s)Q0) + j(H2(s)I0 + H1(s)Q0).$$

Specifically, the in-phase signal I1 and the quadrature signal Q1 are as follows.

$$I1 = H1(s)I0 - H2(s)Q0 \quad (1)$$

$$Q1 = H2(s)I0 + H1(s)Q0 \quad (2)$$

Next, the analog-to-digital converters 102i and 102q convert the analog complex signal (I1+jQ1) into a digital complex signal (I2+jQ2). Next, the digital complex filter 103 applies the following complex operation to the digital complex signal (I2+jQ2) to output a digital complex signal (I3+jQ3).

$$(I3+jQ3)=(H3(z)+jH4(z))\times(I2+jQ2) \quad (3)$$

Because I2=I1 and Q2=Q1, the in-phase signal I3 and the quadrature signal Q3 are obtained by expressions (1), (2), and (3) as follows.

$$I3=(H1(s)H3(z)-H2(s)H4(z))I0-(H1(s)H4(z)+H2(s)H3(z))Q0 \quad (4)$$

$$Q3=(H1(s)H4(z)+H2(s)H3(z))I0+(H1(s)H3(z)-H2(s)H4(z))Q0 \quad (5)$$

Here, because $H3(z)=H1(z)\approx H1(s)$ and $H4(z)=-H2(z)\approx -H2(s)$, one has the following.

$$H1(s)H4(z)+H2(s)H3(z)\approx 0 \quad (6)$$

Therefore, the in-phase signal I3 and the quadrature signal Q3 are obtained by expressions (4), (5), and (6) that as follows.

$$I3\approx(H1(s)H3(z)-H2(s)H4(z))I0 \quad (7)$$

$$Q4\approx(H1(s)H3(z)-H2(s)H4(z))Q0 \quad (8)$$

Thus, the term relating to the quadrature signal Q0 is removed from the in-phase signal I3, and the term relating to the in-phase signal I0 is removed from the quadrature signal Q3.

As described above, the digital complex filter 103 attenuates the quadrature component (a component corresponding to the quadrature signal Q0) of the in-phase signal I2 and outputs the resultant in-phase signal I2 as the in-phase signal I3, and attenuates the in-phase component (a component corresponding to the in-phase signal I0) of the quadrature signal Q2 and outputs the resultant quadrature signal Q2 as the quadrature signal Q3. Thus, the unnecessary component is attenuated in each of the in-phase signal I3 and the quadrature signal Q3, and therefore, the IQ imbalance correction circuit 105 can accurately correct a quadrature error and an amplitude error between the in-phase signal I4 and the quadrature signal Q4. Moreover, the band-pass filter 104 (digital bandwidth limited filter) allows the target component fc1 and the image component fci contained in the digital complex signal (I3+jQ3) to pass therethrough, and attenuates the adjacent interference components fca and fcb contained in the digital complex signal (I3+jQ3). This can reduce a degradation in quality of the target component caused by the leakage of the adjacent interference components, and can further improve the accuracy of correction of the IQ imbalance.

Also, the IQ imbalance can be accurately corrected, whereby the image rejection ratio of the digital complex filter 106 can be improved. This allows the digital signal processing circuit 14 to accurately demodulate data based on the complex signal (I6+jQ6) output from the digital complex filter 106.

(Transfer Function)

Note that the transfer functions of the analog complex filter 101 and the digital complex filter 103 may be set so that the following expressions are satisfied.

$$|H1(s)H4(z)+H2(s)H3(z)|<|H2(s)| \quad (9)$$

$$|H1(s)H4(z)+H2(s)H3(z)|<|H1(s)H3(z)-H2(s)H4(z)| \quad (10)$$

By thus setting the transfer functions, a quadrature component contained in the in-phase signal I3 can be caused to be smaller than a quadrature component contained in the in-phase signal I2, and an in-phase component contained in the quadrature signal Q3 can be caused to be smaller than an in-phase component contained in the quadrature signal Q2. As a result, the accuracy of correction of the IQ imbalance can be improved.

As can be seen from expressions (4) and (5), as "H1(s)H4(z)+H2(s)H3(z)" is closer to "0," an unnecessary component contained in each of the in-phase signal I3 and the quadrature signal Q3 decreases. In particular, by setting the transfer functions of the analog complex filter 101 and the digital complex filter 103 so that "H1(s)H4(z)+H2(s)H3(z)=0" is satisfied, the quadrature component contained in the in-phase signal I3 and the in-phase component contained in the quadrature signal Q3 can be minimized.

(Variation of First Embodiment)

Figure 4:
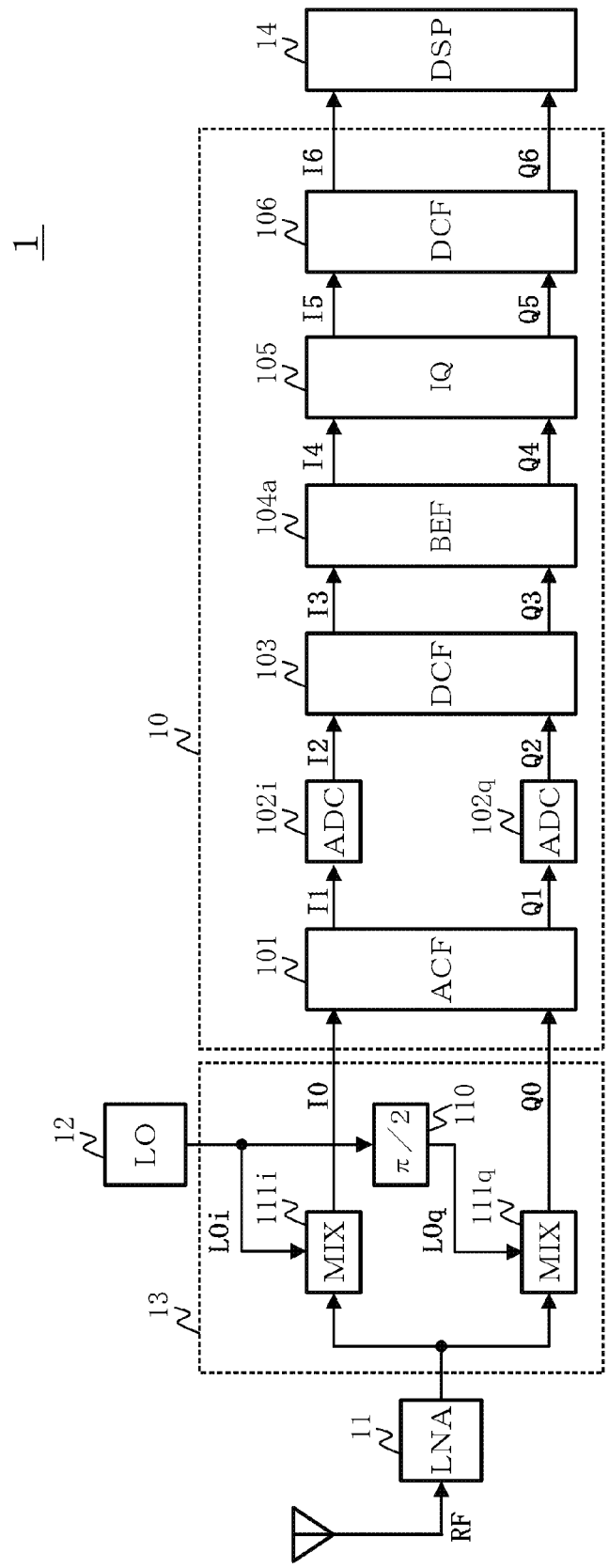
FIG. 4 is a diagram for describing a variation of the receiver circuit of FIG. 1.

Note that as illustrated in FIG. 4, the complex signal processing circuit 10 may include a band-elimination filter (BEF) 104a instead of the band-pass filter 104 of FIG. 1. Similar to the band-pass filter 104, the band-elimination filter 104a (digital bandwidth limited filter) applies a complex operation to an in-phase signal I3 and a quadrature signal Q3 to allow a target component and an image component contained in the digital complex signal (I3+jQ3) to pass therethrough, and to attenuate adjacent interference components contained in the digital complex signal (I3+jQ3), and outputs the operation results as an in-phase signal I4 and a quadrature signal Q4. Here, the band-elimination filter 104a has such a filter characteristic that a stop band includes adjacent frequency bands corresponding to the adjacent interference components contained in the digital complex signal (I3+jQ3), and a passband includes other frequency bands. A degradation in quality of the target component caused by the leakage of the adjacent interference components can be reduced, and the accuracy of correction of the IQ imbalance can further be improved also in this configuration.

Here, operation of the complex signal processing circuit 10 of FIG. 4 will be described with reference to FIGS. 5A-5D. Note that for the sake of simplicity, it is provided that a radio frequency signal RF does not contain an adjacent interference component fcb (an adjacent interference component located on an frequency axis at a higher frequency side than a target component fc1).

Figure 5A:
FIGS. 5A-5D are diagrams for describing operation of the complex signal processing circuit of FIG. 4.

The radio frequency signal RF is converted into an analog complex signal (I0+jQ0) by a quadrature detector 13. As illustrated in FIG. 5A, the analog complex signal (I0+jQ0) contains the target component fc1, an image component fci, and an adjacent interference component fca.

Figure 5B:
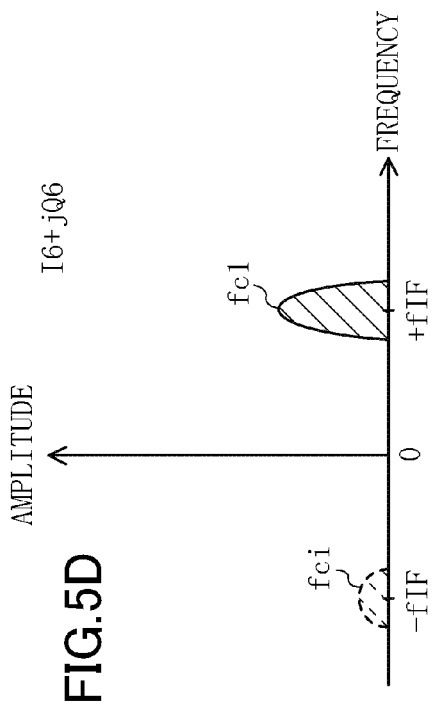

Next, the analog complex filter 101 attenuates the image component fci contained in the analog complex signal (I0+jQ0), and outputs the resultant signal as an analog complex signal (I1+jQ1). As illustrated in FIG. 5B, the signal level of the image component fci contained in the analog complex signal (I1+jQ1) falls within the input range of the analog-to-digital converters 102i and 102q.

Figure 5C:
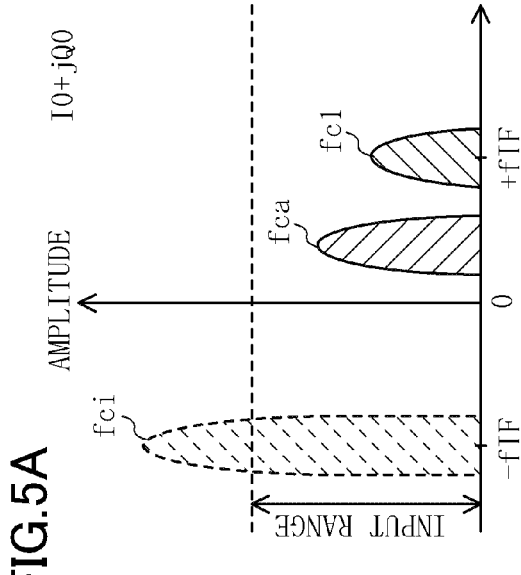

Next, the analog complex signal (I1+jQ1) is processed and converted into the digital complex signal (I3+jQ3) by the analog-to-digital converters 102i and 102q, and a digital complex filter 103. Next, the digital complex signal (I3+jQ3) is converted into the digital complex signal (I4+jQ4) by the band-elimination filter 104a. As illustrated in FIG. 5C, the band-elimination filter 104a has such a filter characteristic f104a that a stop band includes an adjacent frequency band FB3 corresponding to the adjacent interference component fca. Thus, the adjacent interference component fca is removed from the digital complex signal (I3+jQ3), and the target component fc1 and the image component fci contained in the digital complex signal (I3+jQ3) are output as the digital complex signal (I4+jQ4).

Figure 5D:
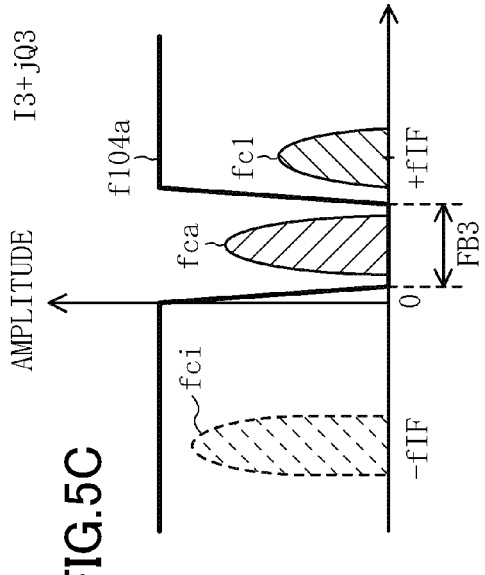

Next, the digital complex signal (I4+jQ4) is processed and converted into a digital complex signal (I6+jQ6) by the IQ imbalance correction circuit 105 and the digital complex filter 106. As illustrated in FIG. 5D, an image component contained in the digital complex signal (I6+jQ6) is rejected by a complex operation of the digital complex filter 106.

Note that a lowpass filter or a decimation filter may be provided at a stage preceding the band-elimination filter 104a. Such a lowpass filter and a decimation filter each preferably have such a filter characteristic that a passband is a low frequency band including a target frequency band FB1, and a stop band is a high frequency band including an adjacent frequency band corresponding to the adjacent interference component fcb (adjacent interference component located on the frequency axis at a higher frequency side than the target component fc1). With this configuration, even when the radio frequency signal RF contains an adjacent interference component fcb, the adjacent interference component fcb can be attenuated by the lowpass characteristics of the lowpass filter or the decimation filter.

(Second Embodiment)

Figure 6:
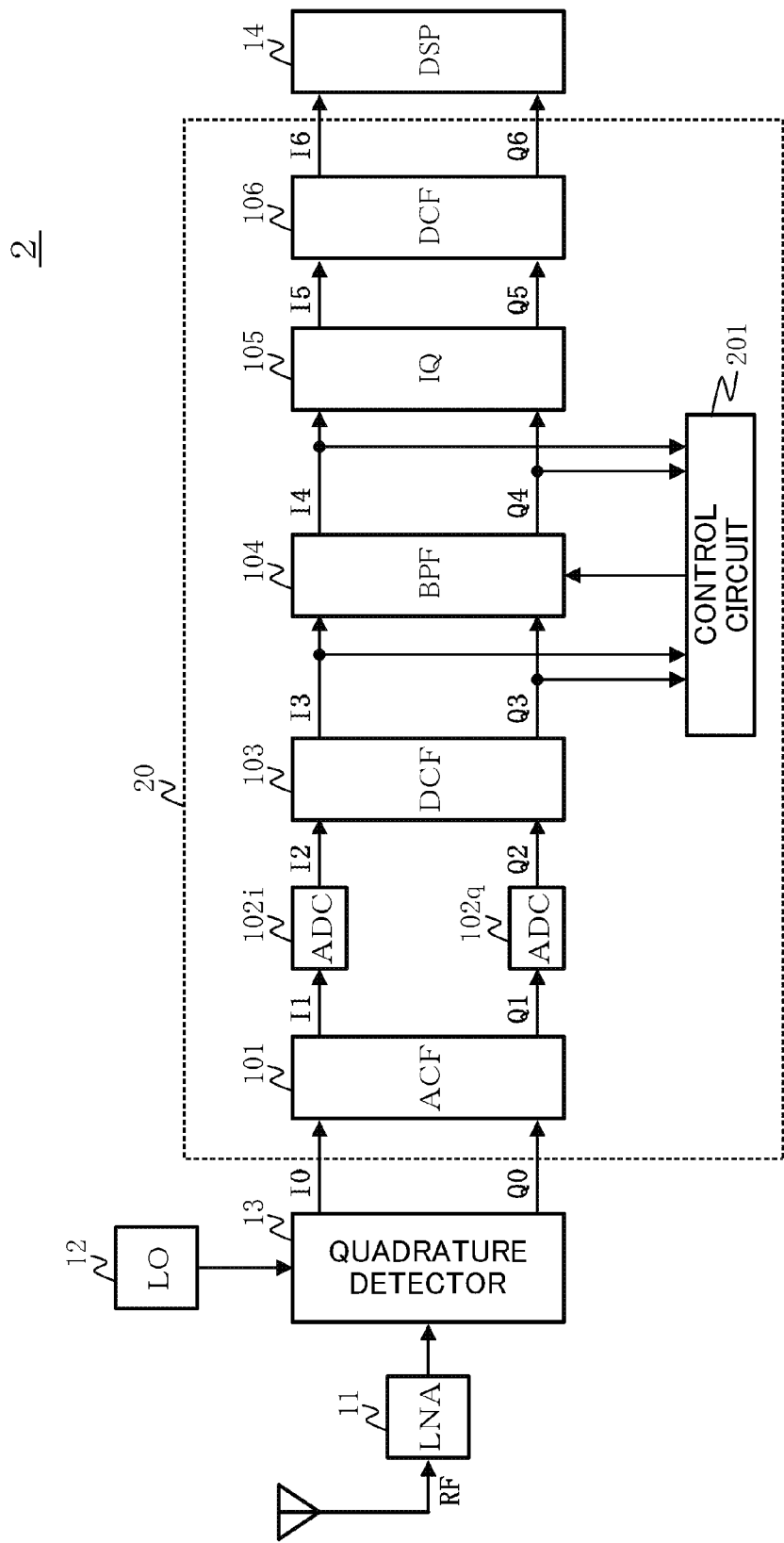
FIG. 6 is a diagram showing an example configuration of a receiver circuit according to a second embodiment.

FIG. 6 shows an example configuration of a receiver circuit according to a second embodiment. The receiver circuit 2 includes a complex signal processing circuit 20 instead of the complex signal processing circuit 10 of FIG. 1. The other components are similar to those of FIG. 1. The complex signal processing circuit 20 includes a control circuit 201 in addition to the components of FIG. 1.

The control circuit 201 calculates the signal level of adjacent interference components contained in a digital complex signal (I3+jQ3) based on the digital complex signal (I3+jQ3), and calculates the signal level of adjacent interference components contained in a digital complex signal (I4+jQ4) based on the digital complex signal (I4+jQ4). Next, the control circuit 201 calculates the difference in adjacent interference component signal level between the digital complex signal (I3+jQ3) and the digital complex signal (I4+jQ4). When the signal level difference is larger than a predetermined value (e.g., such a signal level difference that the image component can satisfactorily be rejected in a digital complex filter 106), the control circuit 201 keeps active a band-pass filter 104. On the other hand, when the signal level difference is smaller than the predetermined value, the control circuit 201 inactivates the band-pass filter 104. The band-pass filter 104, when inactive, directly outputs the in-phase signal I3 and the quadrature signal Q3 as the in-phase signal I4 and the quadrature signal Q4.

As described above, by causing the band-pass filter 104 (digital bandwidth limited filter) to be inactive when it is not necessary to reject adjacent interference components contained in the digital complex signal (I3+jQ3), the unnecessary power consumption of the band-pass filter 104 can be reduced, and moreover, noise occurring due to unnecessary operation of the band-pass filter 104 can be reduced or prevented.

Note that the complex signal processing circuit 20 may include the band-elimination filter 104a of FIG. 4 instead of the band-pass filter 104.

(Signal Reproduction Device)

Figure 7:
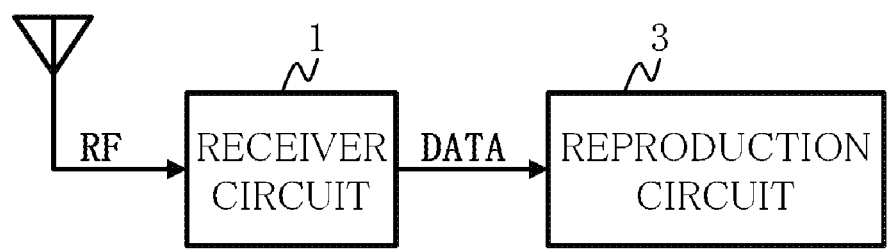
FIG. 7 is a diagram showing an example configuration of a signal reproduction device including the receiver circuit of FIG. 1.
Figure 8:
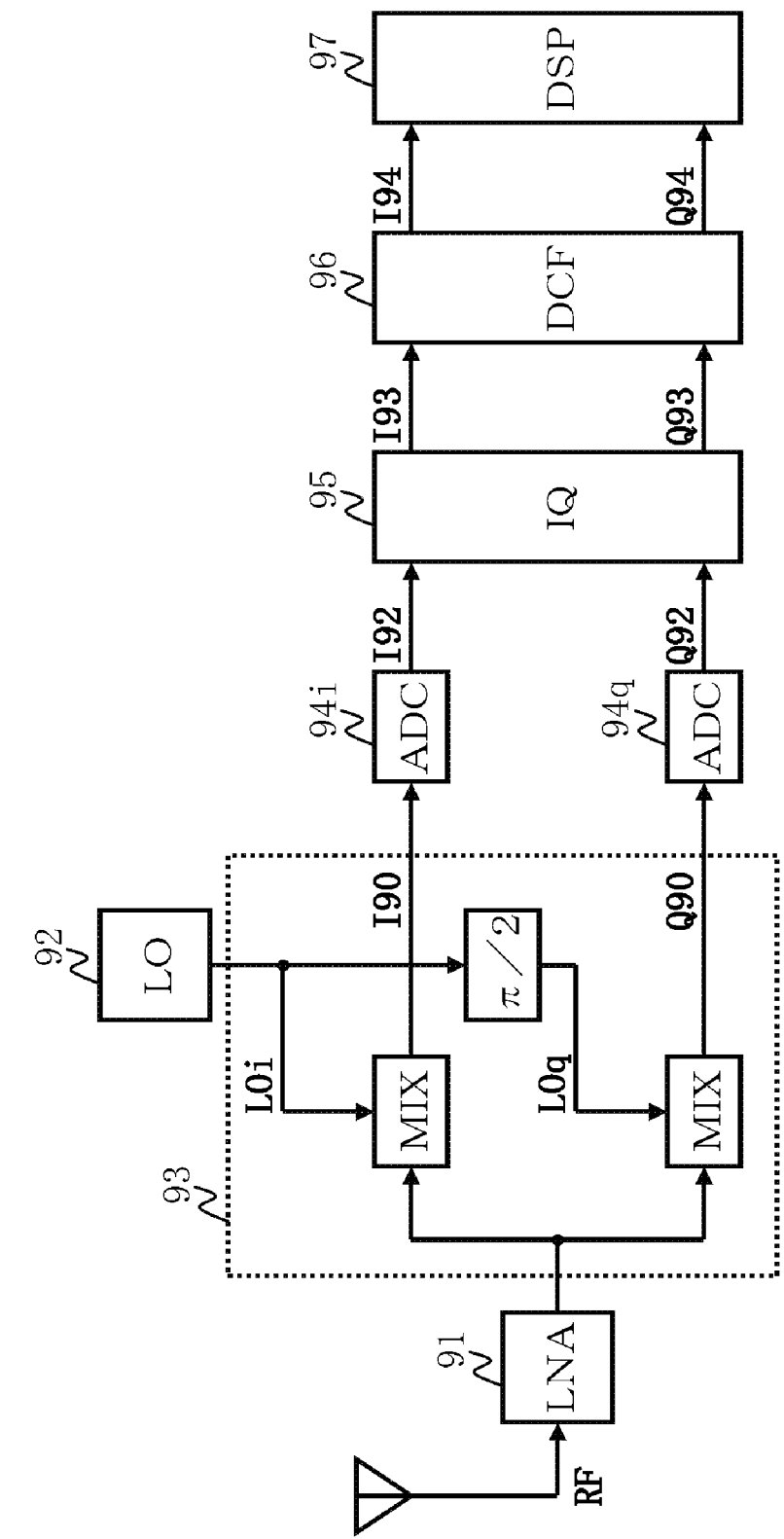
FIG. 8 is a diagram showing an example configuration of a conventional receiver circuit.
Figure 9:
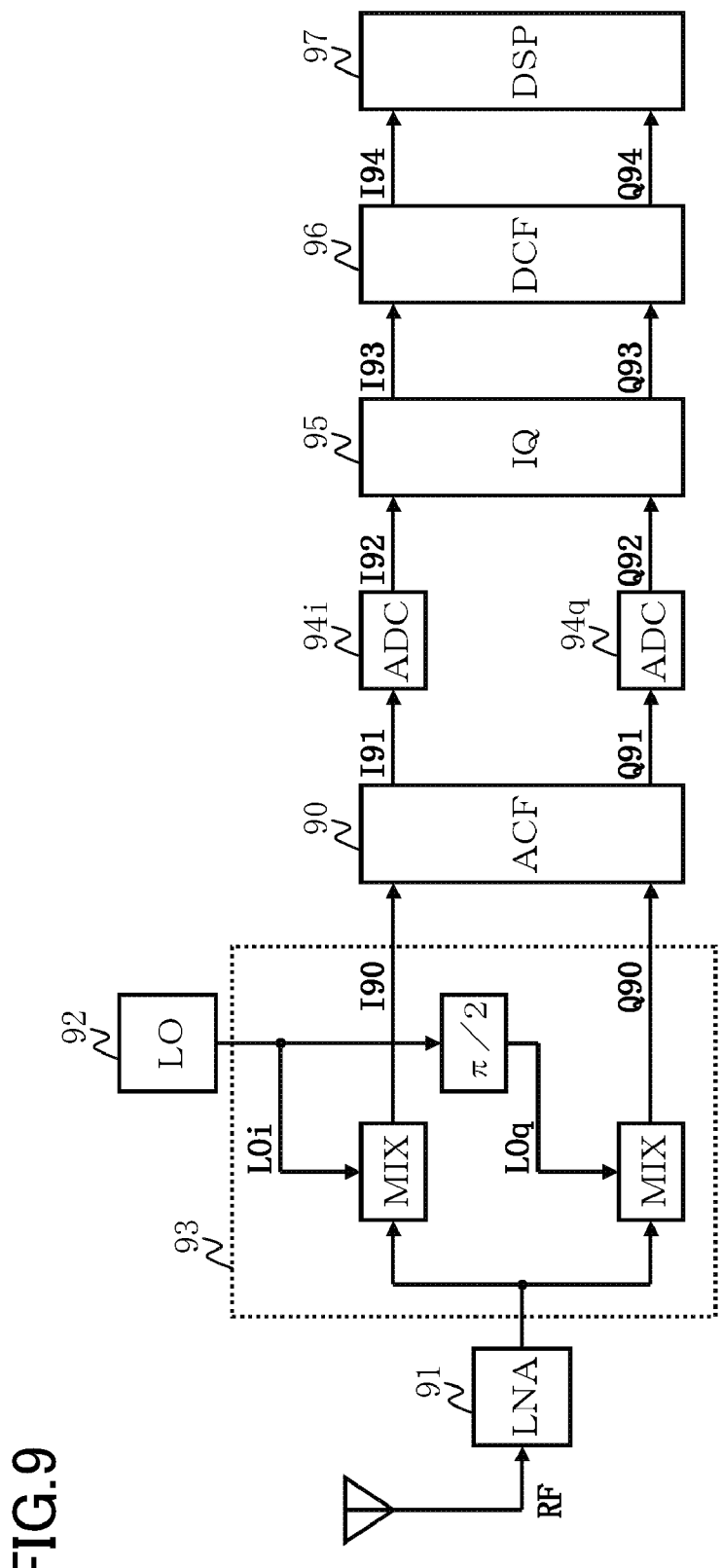
FIG. 9 is a diagram showing an example configuration of a conventional receiver circuit including an analog complex filter.

As shown in FIG. 7, the receiver circuits 1 and 2 are applicable to a signal reproduction device. The signal reproduction device of FIG. 7 receives a radio frequency signal RF and reproduces at least one of video or audio. Examples of the signal reproduction device include audio/video reproduction devices, such as a mobile telephone, a digital television, etc., audio reproduction devices, such as a radio etc., etc. The signal reproduction device includes a reproduction circuit 3 in addition to the receiver circuit 1. The reproduction circuit 3 reproduces at least one of video or audio based on data DATA demodulated by the receiver circuit 1. In the signal reproduction device, data is accurately demodulated by the receiver circuit 1, and therefore, the reproduction circuit 3 can accurately reproduce video and/or audio.

Although it has been assumed in the above embodiments that the receiver circuit processes a radio frequency signal in accordance with the low-IF reception technique, the receiver circuit may process the radio frequency signal in accordance with other IF reception techniques (e.g., zero IF reception etc.).

The aforementioned complex signal processing circuit can improve the accuracy of correction of the IQ imbalance, and therefore, is useful for audio/video reproduction devices, such as a mobile telephone, a digital television, etc., audio reproduction devices, such as a radio etc., etc.

Note that the above embodiments are merely exemplary in nature and are in no way intended to limit the scope of the present disclosure, its application, or uses.

What is claimed is:

1. A complex signal processing circuit for processing an analog complex signal including an in-phase signal and a quadrature signal, comprising:

an analog complex filter configured to combine the in-phase signal with the quadrature signal and output the resultant signal as a first analog signal, and combine the quadrature signal with the in-phase signal and output the resultant signal as a second analog signal, to attenuate an image component contained in the analog complex signal;

an analog-to-digital converter configured to convert the first and second analog signals into first and second digital signals, respectively;

a first digital complex filter configured to apply a complex operation to the first and second digital signals to attenuate a component corresponding to the quadrature signal of the first digital signal and output the resultant signal as a third digital signal, and attenuate a component corresponding to the in-phase signal of the second digital signal and output the resultant signal as a fourth digital signal;

a digital bandwidth limited filter configured to apply a complex operation to the third and fourth digital signals to allow a target component and an image component of a digital complex signal including the third and fourth digital signals to pass therethrough, and attenuate an adjacent interference component adjacent to the target component on a frequency axis, and output the resultant signals as fifth and sixth digital signals; and an IQ imbalance correction circuit configured to correct a quadrature error and an amplitude error between the fifth and sixth digital signals.

2. The complex signal processing circuit of claim 1, wherein the digital bandwidth limited filter includes a band-pass filter having a passband including a frequency band corresponding to the target component and a frequency band corresponding to the image component.

3. The complex signal processing circuit of claim 1, wherein
the digital bandwidth limited filter includes a band-elimination filter having a stop band including a frequency band corresponding to the adjacent interference component adjacent to the target component.

4. The complex signal processing circuit of claim 1, further comprising:
a second digital complex filter configured to reject an image component contained in a digital complex signal including the fifth and sixth digital signals corrected by the IQ imbalance correction circuit.

5. The complex signal processing circuit of claim 1, further comprising:
a control circuit configured to cause the digital bandwidth limited filter to be inactive when a difference in adjacent interference component signal level between the digital complex signal including the third and fourth digital signals and a digital complex signal including the fifth and sixth digital signals is smaller than a predetermined value.

6. A receiver circuit for demodulating data from a radio frequency signal, comprising:
a quadrature detector configured to convert the radio frequency signal into an analog complex signal;
the complex signal processing circuit of claim 1 configured to process the analog complex signal output from the quadrature detector to output a digital complex signal; and
a digital signal processing circuit configured to demodulate data based on the digital complex signal output from the complex signal processing circuit.

7. A signal reproduction device for receiving a radio frequency signal and reproducing at least one of video or audio, comprising:
the receiver circuit of claim 6 configured to demodulate data from the radio frequency signal; and
a reproduction circuit configured to reproduce at least one of video or audio based on the data demodulated by the receiver circuit.

* * * * *